United States Patent [19]
Howard

[11] 4,081,755
[45] Mar. 28, 1978

[54] BAUD RATE GENERATOR UTILIZING SINGLE CLOCK SOURCE

[75] Inventor: James J. Howard, Parsippany, N.J.

[73] Assignee: Litton Business Systems, Inc., Morris Plains, N.J.

[21] Appl. No.: 713,101

[22] Filed: Aug. 10, 1976

[51] Int. Cl.² .................... H03K 21/00; H03K 23/06
[52] U.S. Cl. ........................................ 328/41; 328/46; 328/48; 331/51
[58] Field of Search ................ 307/220 R, 225 R; 331/51; 328/39, 41, 46, 48

[56] References Cited

U.S. PATENT DOCUMENTS

| | | | |
|---|---|---|---|
| 3,147,442 | 9/1964 | Fritzsche et al. | 328/41 |
| 3,287,648 | 11/1966 | Poole | 328/39 |
| 3,571,728 | 3/1971 | Andrea et al. | 328/41 |
| 3,719,897 | 3/1973 | Tarr | 331/51 |
| 3,811,092 | 5/1974 | Charbonnier | 328/39 |
| 3,818,354 | 6/1974 | Tomisawa | 328/41 |
| 3,870,963 | 3/1975 | Groce et al. | 328/41 |

*Primary Examiner*—Stanley D. Miller, Jr.
*Attorney, Agent, or Firm*—Robert F. Rotella; Norman Friedman

[57] ABSTRACT

A baud or repetition rate generator for providing required clock rates from a oscillator utilizing a commonly available crystal by counting to an integer, N, a number of times, $m$, and then counting to N+1 the remaining number of times, $n$, within a cycle having $(m+n)$ parts, and providing an output pulse after each count of N and N+1.

4 Claims, 3 Drawing Figures

FIG. 2

| CLOCK FOR BAUD | S1 | S2 | S3 | S4 | S5 | S6 | S7 | S8 | 17 OUTPUT FROM DIVIDE BY | ERROR, % |
|---|---|---|---|---|---|---|---|---|---|---|
| 9,600 | 1 | 1 | 0 | 1 | 0 | 1 | 0 | 1 | 2 | -.124 |
| 110 | 1 | 1 | 1 | 1 | 1 | 1 | 1 | 1 | 128 | +.09 |
| 7,200 | 1 | 1 | 1 | 1 | 1 | 0 | 0 | 1 | 2 | +.234 |
| 200 | 0 | 0 | 0 | 1 | 1 | 1 | 0 | 1 | 128 | -.124 |
| 134.5 | 0 | 0 | 1 | 1 | 0 | 0 | 0 | 0 | 128 | -.039 |
| 2,000 | 1 | 0 | 1 | 1 | 0 | 0 | 0 | 0 | 8 | -.124 |
| 19,200 | 1 | 0 | 1 | 0 | 1 | 0 | 1 | 1 | 2 | -.124 |

NOTE:
"0" DENOTES "CLOSED SWITCH"
"1" DENOTES "OPEN SWITCH"

BAUD RATE GENERATOR UTILIZING SINGLE CLOCK SOURCE

BACKGROUND OF THE INVENTION

Clock generator circuits have been developed which produce the commonly-used, 16-times-baud clock frequencies used for UART (universal asynchronous receiver transmitter) operation, but these require quartz crystal oscillators especially prepared to provide the basis for division to obtain the desired clock frequencies.

The standard baud rates commonly used belong to one of six families. Some of the families have only one member. The heads of each family, these being the highest baud within a family, are as follows: 19,200; 7,200; 200; 110; 134.5; and 2,000.

The last three are the only members in the respective families. The first three, when divided by powers-of-two, give rise to other standard family members. One of the difficulties has been that of finding a crystal frequency such that all of the required baud rates, for the particular application, could be derived without appreciable error. Because the required baud-rate sets differ from one generator to another, or because the means of derivation employed differ slightly, each generator may require a different crystal frequency.

SUMMARY OF THE INVENTION

It is, therefore, an object of this invention to provide a baud rate generator which utilizes an input frequency which is derived from a readily available crystal of an oscillator.

A further object of this invention is to provide an inexpensive baud rate generator which can produce the commonly used baud rate frequencies.

A still further object of this invention is to provide a baud rate generator which does not require an especially prepared quartz crystal for its oscillator.

Another object of this invention is to provide a baud rate generator which produces the commonly used baud rate frequencies while maintaining a frequency error below 1%.

A still further object of this invention is to provide a baud rate generator which does not operate exclusively by dividing only by integers to achieve the desired baud rate frequencies.

These and other objects of the present invention are accomplished in the illustrative embodiment by employing, in effect, non-integer division of a basic crystal frequency by a digital counter dividing scheme thereby usually eliminating the problem of selecting a crystal frequency. Conceptually this is done by the following means: By counting to an integer, N, a number of times, $m$, and then counting to N+1 the remaining number of times, $n$, within a cycle having $(m+n)$ parts, providing an output pulse after each count of N and N+1, thereby resulting in division by a mixed number, $N+(n/m+n)$, having effectively taken place. The output frequency thus obtained is further divided by the appropriate power-of-two to obtain the resultant desired clock frequency. This is accomplished in the illustrative embodiment by two fully synchronous digital counters, together with other logic circuit elements. A first synchronous counter, controlled by a combination of four switches and a second synchronous counter, counts out a prescribed number of oscillator-derived pulses before issuing an output pulse. This output pulse presets the first synchronous counter and advances the count residing in the second synchronous counter. When the output of the second synchronous counter agrees with the states of a second set of switches, the number of pulses counted by the first synchronous counter will be altered during the next cycle. The output of the first synchronous counter is further subdivided by an eight bit binary counter functioning as a powers-of-2 divider chain. The desired output is then taken from the appropriate divider chain's output terminal.

BRIEF DESCRIPTION OF THE DRAWINGS

The invention is illustrated in the drawings of which:

FIG. 2 is a table showing the settings required of each switch in the generator of FIG. 1 in order to obtain the relevant output.

DETAILED DESCRIPTION OF THE INVENTION

Figure 1:
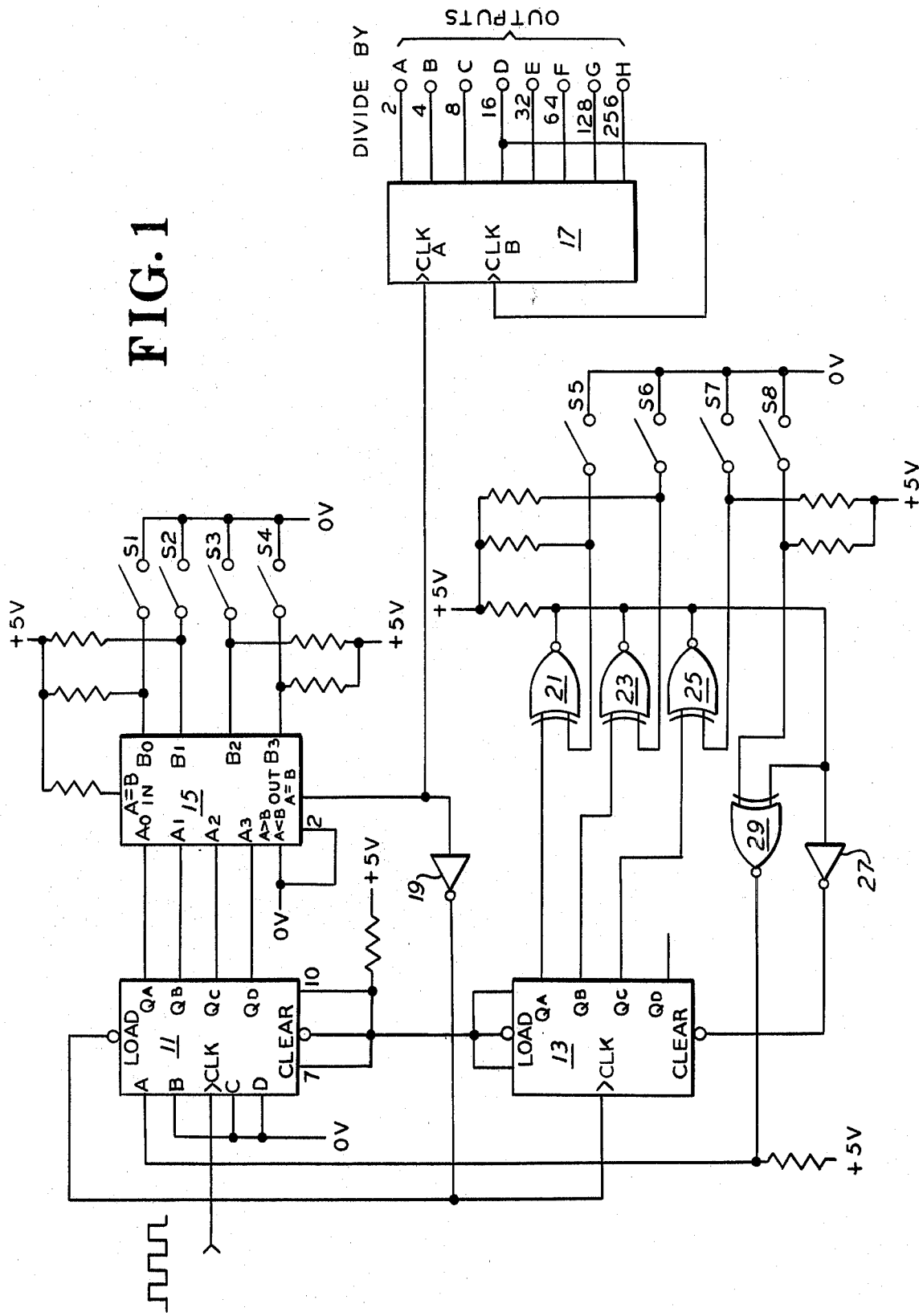
FIG. 1 is a simplified diagram of the 16-times-baud clock generator incorporating the features of this invention.
Figure 3:
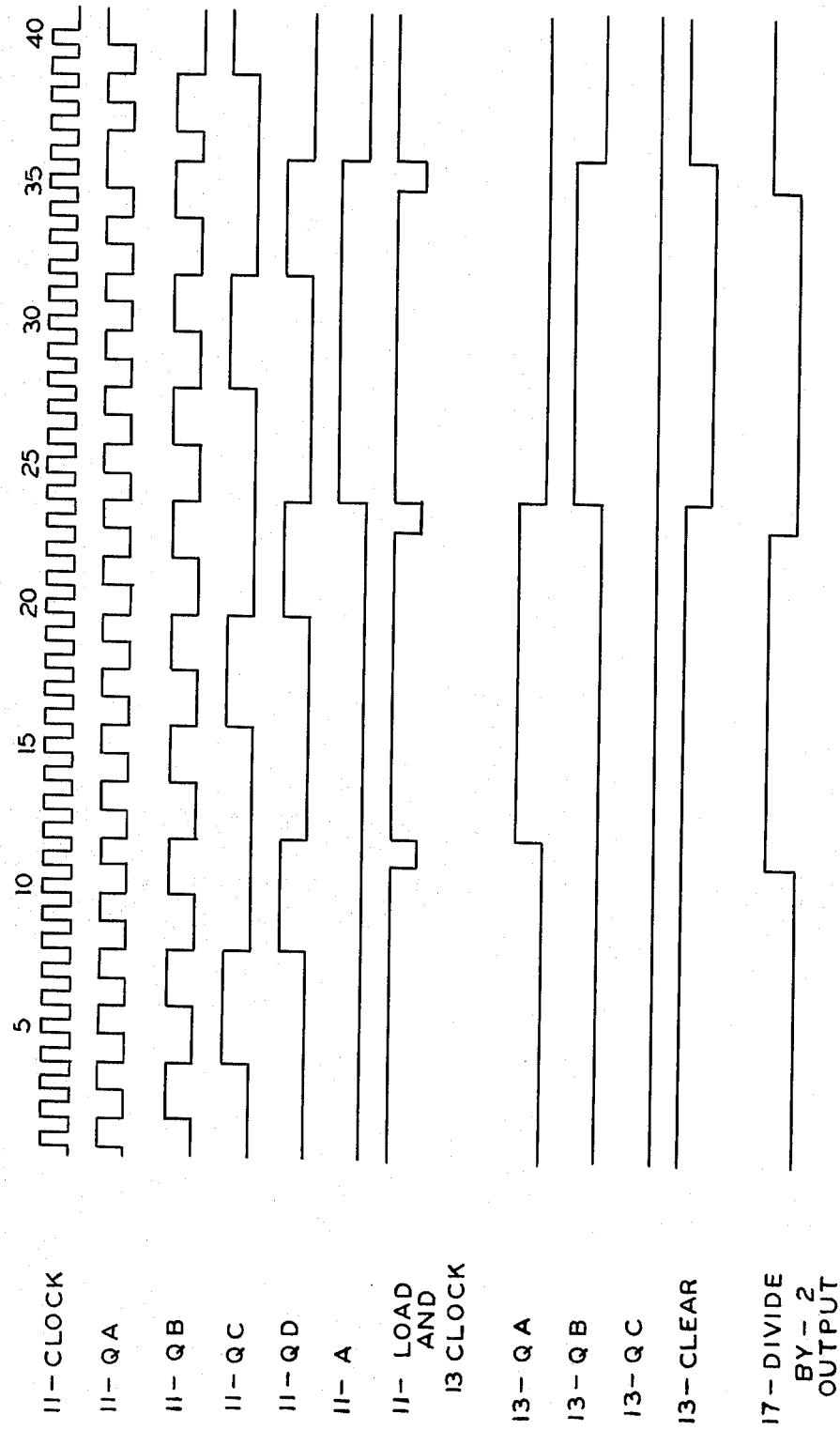
FIG. 3 is a series of waveforms which may be useful in understanding the operation of the embodiment of FIG. 1 for an output clock rate of 9,600 times sixteen.

For the purpose of describing operation of the prefered embodiment, it will be assumed that the switches S1 through S8 are in the positions indicated by the first line of the Table of FIG. 2. Under these conditions, the repetition rate of the output voltage from the divide-by-2 output of this circuit will be 9,600-times-16 pulses per second. Referring now to FIGS. 1 and 3, it will be further assumed that the initial states of the two synchronous counters, 11 and 13, will be such that their outputs, QA, QB, QC, and QD, are all low (logic "0").

An output from a 3.579545 MHz crystal oscillator (not shown) is fed to the clock input of synchronous counter 11. The outputs of 11 will follow a natural binary sequence as it counts the pulses derived from the oscillator. When the binary equivalent of 11 (1011) on the outputs of the synchronous counter 11 are fed to the four inputs of a 4-bit magnitude comparator 15, the A=B comparator output goes high (logic "1"). This output remains high for the duration of the present input clock period.

The comparator output 15 is fed to the clock A input of a dual 4-bit counter powers-of-2 divider), 17, and also fed through an inverter, 19, to the clock input of the synchronous counter 13 and the load input of synchronous counter 11. Each of the three least significant bit outputs from synchronous counter 13 is fed to one input of each of three exclusive OR-invert gates 21, 23, 25. Because the inputs of each of the exclusive OR-invert gates, 21, 23, and 25 do not agree, the A input (least significant bit) of the synchronous counter 11, which is coupled to the outputs of said three exclusive OR-invert gates, will be low (logic "0").

This being the case, binary 0 (000) will be loaded into the synchronous counter 11 and appear at the outputs of 11 after the next positive-going transition of the input clock coupled to 11. When this occurs, the inverted output from comparator 15 goes high (logic "1") causing the load input of 11 to go high and the outputs from 13 to go from binary 0 to binary 1. Note that the outputs do not yet agree with the corresponding inputs of the exclusive OR-invert gates 21, 23, 25. Note also that this occurs after a count-of-12 (0 to 11).

The process will therefore be again repeated starting with the preloading of synchronous counter 11. This time, however, the output of synchronous counter 13 will change from binary 1 to binary 2. When this occurs, the inputs of each of the exclusive OR-invert gates 21, 23 and 25 agree, allowing their outputs to go high. This output is inverted by inverter 27 and fed to the clear input of synchronous counter 13. The output is also fed to one input of another open-collector, exclusive OR-invert gate, 29. Because S8 is open, the output from exclusive OR-invert gate 29 also goes high. This will cause the next count cycle of synchronous counter 11 to be shorter by 1 count, because a binary 1 will have been preloaded at the beginning of that cycle instead of a binary 0.

Because 13, like 11, is a synchronous counter, the next positive-going transition of its clock input will cause its outputs to clear to zero. This occurs only after the preset inputs of synchronous counter 11 appear at the outputs of synchronous counter 11.

The cycle will continue to repeat itself with synchronous counter 11 executing a count-of-12 twice, and a count-of-11 once. The 9,600-times-16 pulses-per-second rate is obtained from the divide-by-2 output terminal of 17 with nearly 50% duty cycle.

It should be noted that the states of the outputs of synchronous counters 11 and 13 assumed originally are arbitrary, because during normal operation, using the switch settings given, the outputs are never in those states at the same time.

Other possible modifications include:

1. Use all four output bits of synchronous counter 13 and feed them to another comparator like 15, instead of the three-bit comparator consisting of 21, 23 and 25.

2. Use a binary-coded, one-of-sixteen data selector, providing high-low switching at each of the sixteen data inputs of the data selector.

The aforementioned four-bit comparator could then be used to reset the synchronous counter's outputs to zero after the desired number of count cycles had taken place. The output of the aforementioned data selector would then also become the A-input of synchronous counter 11, while the four binary-coded input lines would be connected to the four output lines of synchronous counter 13. This modification would permit the use of fractional parts such as 7/13, 4/7, and the like, as suggested earlier by reference to the general term, $n/(m+n)$.

The method for obtaining the 134.5 and 2,000 baud clocks, as indicated in the table of FIG. 2 is conventional and does not employ, in the strict sense, the features of this invention, requiring division by integers 13 and 14, respectively. They are included only for the sake of completeness.

In the preferred embodiment conventional synchronous counters 11 and 13 were used such as the Texas Instrument 74LS163, a conventional comparator 15 such as the Texas Instrument 74LS85, and conventional exclusive OR-invert gates 21, 23, 25 and 29 such as the Texas Instrument 74LS266.

Obviously many modifications and variations of the present invention are possible in light of the above teachings. It is therefore, to be understood that within the scope of the appended claims, the invention may be practiced otherwise than as specifically described.

What is claimed is:

1. A clock rate generator comprising;
    a first synchronous counter means having clock input, load input, data input and clear input terminals and output terminals,
    a second synchronous counter means having clock input, load input, clear input, and output terminals,
    first comparator means, having its input coupled to the output of said first synchronous counter means, and its output coupled to the clock input of said second synchronous counter means and to the load input of said first synchronous counter means, and
    second comparator means, having its input coupled to the output of said second synchronous counter means and its output coupled to a data input of said first synchronous counter means and to the clear input of said second synchronous counter means,
    said second synchronous counter means load input terminal being connected to said first synchronous counter means clear terminal.

2. A clock rate generator according to claim 1 further including;
    a power-of-2 counter means, having its input coupled to the output of said second comparator means.

3. A clock rate generator according to claim 2 wherein said power-of-2 counter means includes a dual 4-bit counter having a plurality of output terminals.

4. A clock rate generator according to claim 1 wherein each of said first and second comparator means includes a plurality of selectable switch means for changing the comparators comparison state.

* * * * *